(12) United States Patent
Cho et al.

(10) Patent No.: US 10,306,781 B2
(45) Date of Patent: May 28, 2019

(54) CONTROL UNIT AND DISPLAY DEVICE COMPRISING THE SAME

(71) Applicant: LG ELECTRONICS INC., Seoul (KR)

(72) Inventors: Dongwoo Cho, Seoul (JP); Hyunjung Kang, Seoul (JP); Dongyoup Kwak, Seoul (JP); Sanggeol Kim, Seoul (JP); Mounghwan Choi, Seoul (JP)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/632,749

(22) Filed: Jun. 26, 2017

(65) Prior Publication Data
US 2018/0027672 A1  Jan. 25, 2018

Related U.S. Application Data

(60) Provisional application No. 62/366,106, filed on Jul. 24, 2016.

(30) Foreign Application Priority Data

Sep. 1, 2016 (KR) .................. 10-2016-0112644

(51) Int. Cl.
*H05K 5/00* (2006.01)
*H04R 1/02* (2006.01)
(Continued)

(52) U.S. Cl.
CPC ............ *H05K 5/0017* (2013.01); *H04N 5/64* (2013.01); *H04N 5/642* (2013.01); *H04R 1/028* (2013.01);
(Continued)

(58) Field of Classification Search
CPC .. H05K 5/0017; H05K 5/0004; H05K 5/0234; H05K 7/20972; H05K 7/20172;
(Continued)

(56) References Cited

U.S. PATENT DOCUMENTS 5,838,537 A * 11/1998 Lundgren ............. G06F 1/1616
361/679.27
6,137,688 A * 10/2000 Borkar .................... G06F 1/183
174/363

(Continued)

FOREIGN PATENT DOCUMENTS

WO    WO 2009/156571 A1    12/2009

*Primary Examiner* — Anatoly Vortman
*Assistant Examiner* — Stephen S Sul
(74) *Attorney, Agent, or Firm* — Birch, Stewart, Kolasch & Birch, LLP

(57) ABSTRACT

There is disclosed a control unit and a display device comprising the same. The control unit of this invention may comprise a bottom case having an accommodation space; a top case positioned above the bottom case, the top case covering the accommodation space; a stand installed in the accommodation space, the stand positioned between the bottom case and the top case; a first electronic component positioned between the bottom case and the stand; a second electronic component positioned between the stand and the top case; and an air fan positioned between the stand and the top case, the air fan located adjacent to at least one of the first and second electronic components.

17 Claims, 22 Drawing Sheets

(51) Int. Cl.
  *H05K 5/02* (2006.01)
  *H05K 7/20* (2006.01)
  *H04N 5/64* (2006.01)
  *H01L 51/52* (2006.01)

(52) U.S. Cl.
  CPC ......... *H05K 5/0004* (2013.01); *H05K 5/0234* (2013.01); *H05K 5/0247* (2013.01); *H05K 7/20972* (2013.01); *H01L 51/524* (2013.01); *H04R 2499/15* (2013.01); *H05K 7/20172* (2013.01); *H05K 7/20436* (2013.01)

(58) Field of Classification Search
  CPC ........... H05K 7/20436; H05K 5/0217–5/0247; H05K 7/20409; H05K 7/20; H05K 7/20954; H05K 7/20963; H04N 5/642; H04N 5/64; H04R 1/028; H04R 2499/15; H01L 51/524; G06F 1/20–1/206; G06F 1/1601; G06F 1/1605
  USPC ............ 361/679.01, 679.02, 622, 627, 361/679.21–679.25, 679.26–679.29, 361/679.55, 679.04–679.07
  See application file for complete search history.

(56) References Cited

U.S. PATENT DOCUMENTS

| | | | |
|---|---|---|---|
| 6,181,550 B1 * | 1/2001 | Kim | G06F 1/1616 361/679.06 |
| 7,889,505 B1 * | 2/2011 | Beard | H04R 1/025 361/730 |
| 8,072,748 B2 * | 12/2011 | Baller | G06F 1/1688 248/118 |
| 9,319,775 B2 * | 4/2016 | Youn | H04R 1/323 |
| 2002/0075636 A1 * | 6/2002 | Umetsu | G06F 1/1616 361/679.23 |
| 2002/0141164 A1 * | 10/2002 | Watanabe | H04R 5/02 361/749 |
| 2005/0185376 A1 * | 8/2005 | Sawyer | G06F 1/1616 361/679.09 |
| 2008/0158803 A1 * | 7/2008 | Sakata | G06F 1/1605 361/679.23 |
| 2009/0135563 A1 | 5/2009 | Sakata | |
| 2011/0069055 A1 | 3/2011 | Jung et al. | |
| 2011/0116218 A1 * | 5/2011 | Choi | H04N 5/64 361/679.01 |
| 2011/0135133 A1 * | 6/2011 | Choi | G06F 1/1601 381/333 |
| 2011/0238193 A1 | 9/2011 | Yana et al. | |
| 2012/0050985 A1 * | 3/2012 | Kim | G06F 1/1633 361/679.47 |
| 2012/0163645 A1 * | 6/2012 | Hwang | H05K 5/02 381/333 |
| 2013/0021747 A1 | 1/2013 | Guan | |
| 2013/0057785 A1 | 3/2013 | Hiratomo et al. | |
| 2016/0041582 A1 * | 2/2016 | Kim | G06F 1/1605 361/679.22 |
| 2016/0076691 A1 * | 3/2016 | Dai | F16M 11/06 361/679.01 |
| 2016/0183388 A1 * | 6/2016 | Murakami | G06F 1/184 361/679.21 |
| 2017/0055054 A1 * | 2/2017 | Brogan | A45C 11/00 |

* cited by examiner

CONTROL UNIT AND DISPLAY DEVICE COMPRISING THE SAME

This application claims the benefit of U.S. Provisional Patent Application No. 62/366,106 filed on Jul. 24, 2016 and Korean Patent Application No. 10-2016-0112644 filed on Sep. 1, 2016, the entire contents of which are incorporated herein by reference for all purposes as if fully set forth herein.

BACKGROUND OF THE INVENTION

Field of the Invention

This invention is related to a control unit and a display device including the same.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

An OLED panel can display an image by depositing an organic layer capable of emitting light on a substrate on which a transparent electrode is formed. OLED panels are not only thin but also have flexible property. Research has been conducted on the structural properties of the display device having such an OLED panel.

In recent years, in order to implement various designs of display devices, a sound system or an image control system provided in a display device tends to be separated from a display panel.

SUMMARY OF THE INVENTION

Accordingly, an object of the present disclosure is to address the above-described and other problems.

Another object of the present disclosure is to solve a problem regarding heat generated in the electronic components separated from the display panel.

Another object of the present disclosure is to cool stacked electronic components effectively.

According to an aspect of this invention in order to implement above or another object, there is provided a control unit comprising: a bottom case having an accommodation space; a top case positioned above the bottom case, the top case covering the accommodation space; a stand installed in the accommodation space, the stand positioned between the bottom case and the top case; a first electronic component positioned between the bottom case and the stand; a second electronic component positioned between the stand and the top case; and an air fan positioned between the stand and the top case, the air fan located adjacent to at least one of the first and second electronic components.

According to another aspect of this invention, there is provided a display device comprising: a head including a display panel; and the control unit. The control unit may be spaced apart from the head and connected to the head electrically.

According to at least one of embodiments of this invention, heating problem from the electronic components separated from the display panel, may be solved.

According to at least one of embodiments of this invention, the stacked electronic components may be cooled effectively.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
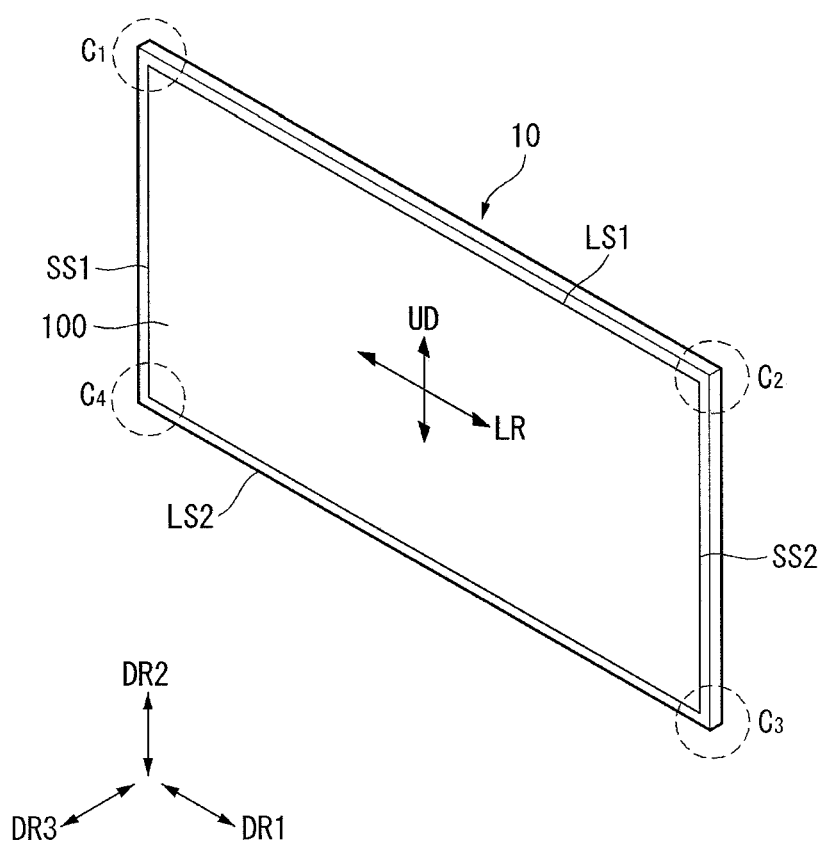
FIGS. 1 to 5 show examples of display device related to the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, an organic light emitting diode (OLED) will be described as an example of a display panel. However, the display panel applicable to the present invention is not limited to an OLED panel. Plasma display panel (PDP), a field emission display (FED), and a liquid crystal display (LCD) are applicable to the present invention.

Referring to FIG. 1, a display device 100 or a head 10 may include a first long side LS1, a second long side LS2 opposite the first long side LS1, a first short side SS1 adjacent to the first long side LS1 and the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device 100, and a second direction DR2 may be a direction parallel to the short sides SS1 and SS2 of the display device 100.

Further, a third direction DR3 may be a direction vertical to the first direction DR1 and/or the second direction DR2.

In the embodiment disclosed herein, the first direction DR1 and the second direction DR2 may be commonly referred to as a horizontal direction. Further, the third direction DR3 may be referred to as a vertical direction.

In another point of view, a side or a surface, on which the display device 100 displays an image, may be referred to as a front side or a front surface. When the display device 100 displays the image, a side or a surface, at which the image cannot be observed, may be referred to as a back side or a back surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In the embodiment disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
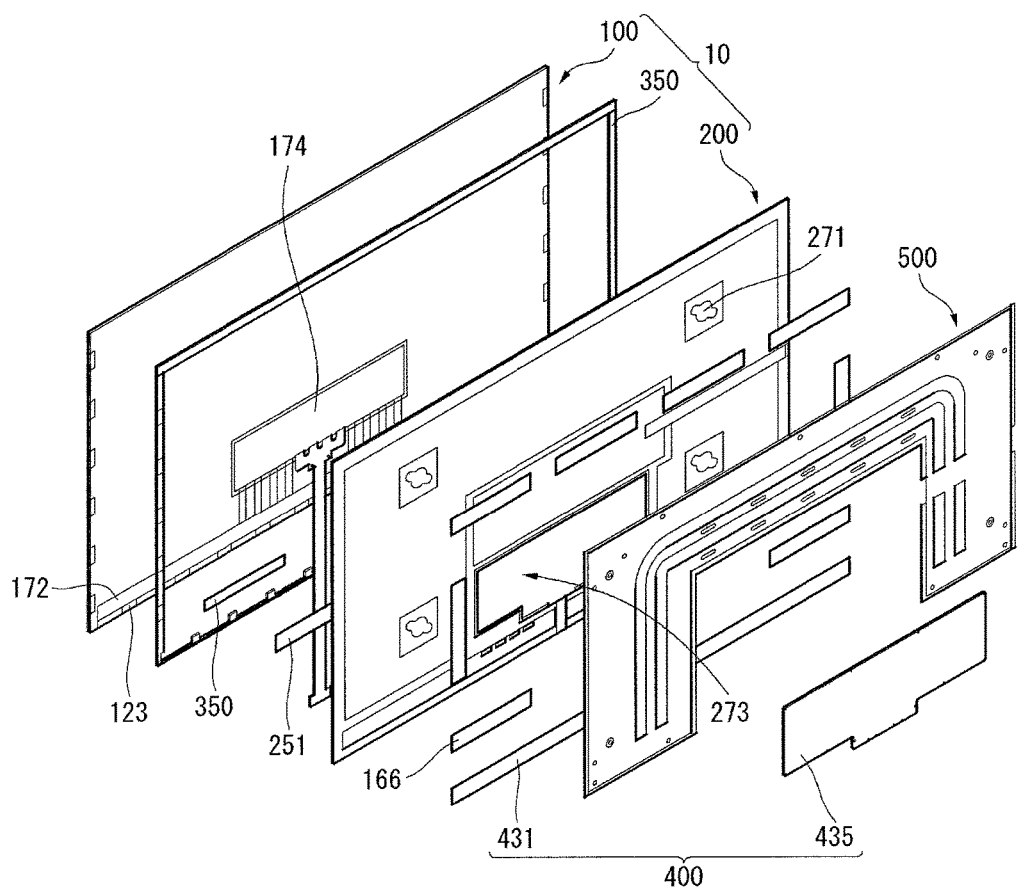
Figure 2:
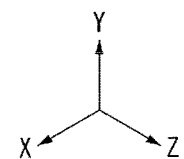

Referring FIG. 2, Head 10 may include a display panel 100, a back cover 200, and a PCB cover 400. The head 10 may be referred to as a display unit 10.

The display panel 100 may be provided on the front surface of the head 10 and display images. The display panel 100 divides an image into a plurality of pixels, and outputs an image by adjusting color, brightness, and saturation of each pixel.

The display panel 100 may be an organic light emitting diode (OLED) panel. The display panel 100 may be a liquid crystal display (LCD) panel.

The interface PCB 174 and the at least one source PCB 172 may be located on at the rear surface of the display panel 100. The interface PCB 174 may be located upwardly with respect to at least one source PCB 172. At least one source PCB 172 may be coupled to the interface PCB 174. Each source PCB 172 may be spaced apart from one another.

The interface PCB 174 may be connected to signal wires for transmitting digital video data, timing control signals, etc., transmitted from the timing controller board of the housing.

At least one source PCB 172 may apply a voltage to the display panel 100 in accordance with a signal transmitted from the interface PCB 174. That is, at least one source PCB 172 may apply a driving waveform to the display panel 100 according to a video signal. The source PCB 172 may be connected to the display panel 100 by a source COF (Chip On Film) 123. The source COF 123 connected to one side of the source PCB 172 may extend to the lower side of the display panel 100 and be connected to the display panel 100.

The source COF 123 may be electrically connected to the source PCB 172 and the data pads of the display panel 100. A data integrated circuit may be mounted in the source COF 123.

The adhesive sheet 350 may be positioned on the rear surface of the display panel 100 to couple the display panel 100 and the back cover 200 together. The adhesive sheet 350 may be in the form of a rectangular frame with an empty center. Since the center of the adhesive sheet 350 is empty, at least one PCB can be placed in an empty space.

A surface of the adhesive sheet 350 is coupled to the display panel 100, and another surface of the adhesive sheet 350 is coupled to the back cover 200.

The insulating sheet 251 may be positioned corresponding to the source PCB 172. The insulating sheet 251 may be attached to the front surface of the back cover 200. The insulating sheet 251 may include an insulating material such that the source PCB 172 is not interfered with by other electronic devices. For example, the PCB cover 400 may comprise a plastic material. Accordingly, the PCB cover 400 can protect the source PCB 172 from a leakage current.

The back cover 200 may be provided on the rear surface of the display panel 100. The back cover 200 can be attached to the display panel 100 by the adhesive sheet 350. The back cover 200 can support the rear surface of the display panel 100. Rigidity of the display panel 100 can be reinforced by the back cover 200. The back cover 200 may include a lightweight and high-strength material. For example, the back cover 200 may comprise aluminum.

The back cover 200 may have a different thickness depending on the position. The back cover 200 may by formed by 'forming process'. The thickness of the edge region of the back cover 200 may be greater than the thickness of the other position of the back cover 200. Since the back cover 200 is formed by 'forming process', the rigidity of the back cover 200 can be improved.

The coupling hole 271 may be positioned adjacent to the four corners of the back cover 200. The coupling hole 271 may be a portion penetrating the back cover 200. The coupling hole 271 can help the head to join the wall bracket 500. The thickness in the vertical direction of the portion of the back cover 200 where the coupling hole 271 is located may be thicker than the thickness in the other direction. Accordingly, the wall bracket 500 and the head 10 are adjacent to each other, so that the binding force can be strengthened.

The coupling portion 166 can be positioned at the edge of the back cover 200. The coupling portion 166 may be located on at least one side of the back cover 200. The coupling portion 166 may protrude from the back cover 200 rearward. Accordingly, the portion where the coupling portion 166 is located may be the same or similar in vertical height to the portion where the coupling hole 271 of the back cover 200 is located. The position of the coupling portion 166 is not limited and may be located at any portion of the back cover 200 if the thickness of the portion of the back cover 200 is thin.

The coupling portion 166 may include a magnetic material. The coupling portion 166 may contribute to engaging of the head 10 and the wall bracket 500 by using magnetism.

The back cover 200 may have an opening 273 at a portion corresponding to the interface PCB 174 when the back cover 200 is coupled. For example, the opening 273 may be located at the center of the back cover 200. The opening 273 can provide a space for the interface PCB 174 to be positioned between the display panel 100 and the back cover 200. If too much opening 273 is formed in the back cover 200, cracks may be formed in the back cover 200 or the rigidity may be weakened. Accordingly, it is preferable that the back cover 200 has a small opening 273.

A PCB cover 400 may be positioned at a rear of the PCB. The PCB cover 400 may include first and second PCB covers 431 and 435. The first PCB cover 431 may be positioned at a rear of the source PCB 172 and the second PCB cover 435 may be positioned at a rear of the interface PCB 174. That is, the second PCB cover 435 may cover the opening 273. The PCB cover 400 may prevent the source PCB 172 and the interface PCB 174 from being exposed to the outside. Accordingly, the PCB cover 400 may be opaque so that the source PCB 172 and the interface PCB 174 are not invisible to the outside.

The PCB cover 400 may include a material that is electrically insulative so that the source PCB 172 and the interface PCB 174 are not interfered with by other electronic devices. For example, the PCB cover 400 may comprise a plastic material. Accordingly, the PCB cover 400 can protect the source PCB 172 and the interface PCB 174 from leakage currents.

The display panel 100 can be supported by only the back cover 200. That is, the head 10 may not include the cover other than the back cover 200. Accordingly, the user can feel that the thickness of the head 10 is very thin, and can concentrate more on the display screen.

Figure 3:
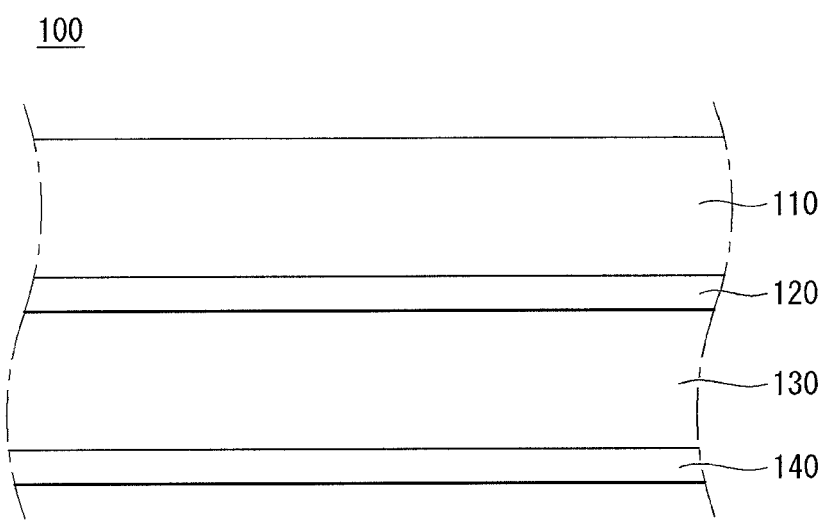

Referring to FIG. 3, the display panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material. The lower electrode 140 may include a non-transparent material. The lower electrode 140 may include a transparent material (for example, ITO). In this case, light may be emitted to a surface of the lower electrode 140.

When a voltage is applied to the upper electrode 120 and lower electrode 140, light emitted from the organic light emitting layer 130 may be transmitted through the upper electrode 120 and the transparent substrate 110 to be emitted to the outside. At this time, a light shielding plate may be further formed behind the lower electrode 140 to emit the light emitted to the lower electrode 140 to the front surface.

Figure 4:
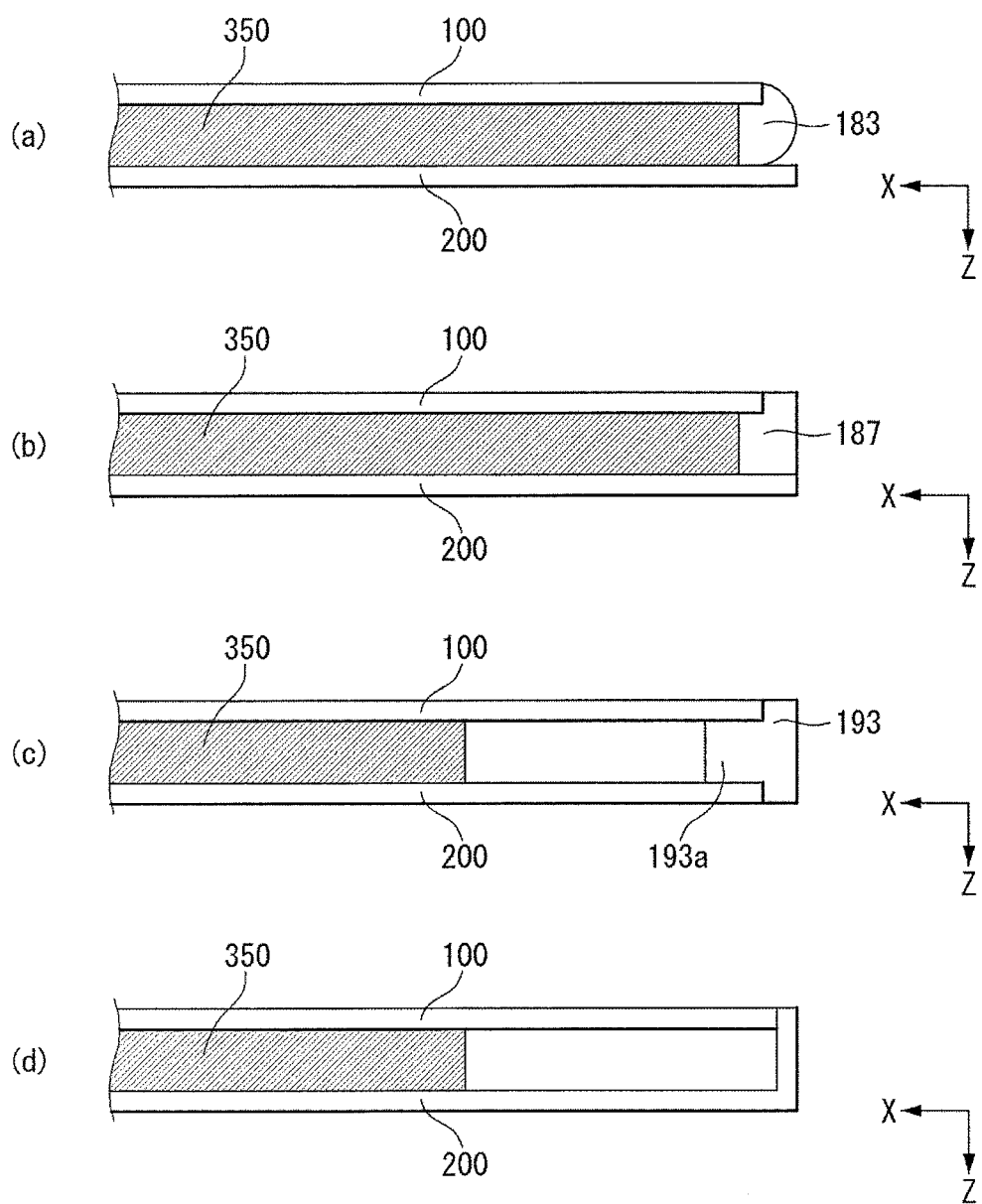

Referring to FIG. 4, the display panel 100 may be attached to the back cover 200 by an adhesive sheet 350. The adhesive sheet 350 may include a double-sided tape.

The adhesive sheet 350 may have a thickness. Accordingly, foreign substances or dust may enter between the display panel 100 and the back cover 200. In order to prevent this, as shown in FIG. 4 (a), the sealing member 183 can be side-sealed to at least a side of the adhesive sheet 350. The sealing member 183 can shield at least one side of the adhesive sheet 350 and the display panel 100 at the same time.

As another example, the frame 187 may be inserted into at least one side of the adhesive sheet 350, as shown in FIG. 4 (b). The frame 187 may contact at least one side of the adhesive sheet 350 and may be bent so that one end of the frame 187 extends toward the display panel 100. Accordingly, at least one side of the display panel 100 can be simultaneously shielded.

As another example, the middle cabinet 193 may be positioned between the display panel 100 and the back cover 200, as shown in FIG. 4 (c). The middle cabinet 193 can guide the position where the display panel 100 is coupled. The flange 193a of the middle cabinet 193 can be inserted between the display panel 100 and the back cover 200. The middle cabinet 193 can shield at least one side of the display panel 100 and the back cover 200 at the same time.

The flange 193a of the middle cabinet 193 may be spaced apart from the adhesive sheet 350. Accordingly, since the adhesive sheet 350 does not need to be entirely placed on the display panel 100, the amount of the adhesive sheet 350 for the display device can be reduced.

As another example, the edge portion of the back cover 200 may be bent toward the display panel 100, as shown in FIG. 4 (*d*). Since the edge portion of the back cover 200 is bent, at least one side of the adhesive sheet 350 can be shielded from the outside.

In this case, other materials may not be included between the display panel 100 and the back cover 200. Thus, the manufacturing process of the display device can be simplified, and the cost can be saved. Further, the edge of the back cover 200 can be separated from the adhesive sheet 350. Accordingly, since the adhesive sheet 350 does not need to be entirely placed on the display panel 100, the amount of the adhesive sheet 350 for the display device can be reduced.

Figure 5:
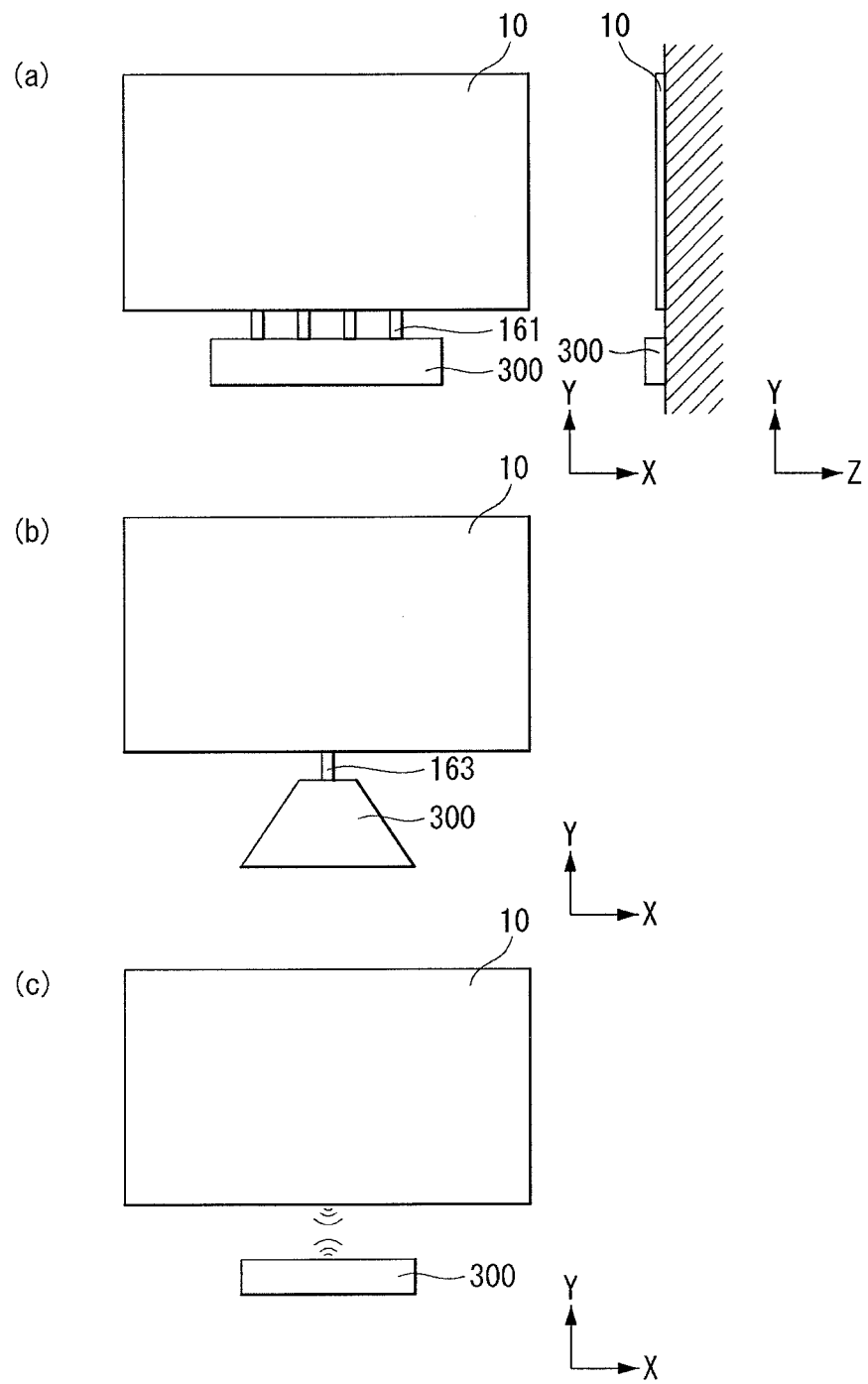

Referring to FIG. 5, the display device may include a housing 300 electrically connected to the head 10.

The housing 300 can transmit at least one signal to the head 10. The housing 300 may shield the components that drive the display device. For example, the housing 300 may shield at least one printed circuit board (PCB). The detailed coupling structure of the at least one printed circuit board and the method of coupling the at least one printed circuit board will be described later.

Housing 300 may be spaced apart from the head 10. So the users may concentrate on a displayed screen.

For example, as shown in FIG. 5 (*a*), the housing 300 may be connected to the head unit 10 through a plurality of flat cables 161 having a flat shape. The flat cable 161 may include a plurality of signal connection terminal pins and at least one ground terminal pin for connecting the housing 300 and the head unit 10. The flat cable 161 is advantageous in cost compared to other cables.

As another example, as shown in FIG. 5 (*b*), the housing 300 can be engaged with the head 10 through one circular cable 163. That is, a plurality of flat cables 161 in FIG. 3 (*b*), can be connected through a single circular cable 163 in FIG. 5(*b*). Since the housing 300 and the head unit 10 are connected through a single circular cable 163 rather than a plurality of circular cables 163, the user can feel that the appearance is cleaner.

As another example, as shown in FIG. 5 (*c*), the housing 300 and the head unit 10 can exchange electric signals wirelessly. In this case, the user may feel that the appearance is cleaner than when the housing 300 and the head 10 are connected through the flat cable 161 or the circular cable 163.

The housing 300 may be described below as a sound system or control system or control unit. The case may designate a frame in which a plurality of electronic components or a boundary between inside and outside of the control unit. The set of electronic components may be referred to as an electrical unit.

Figure 6:
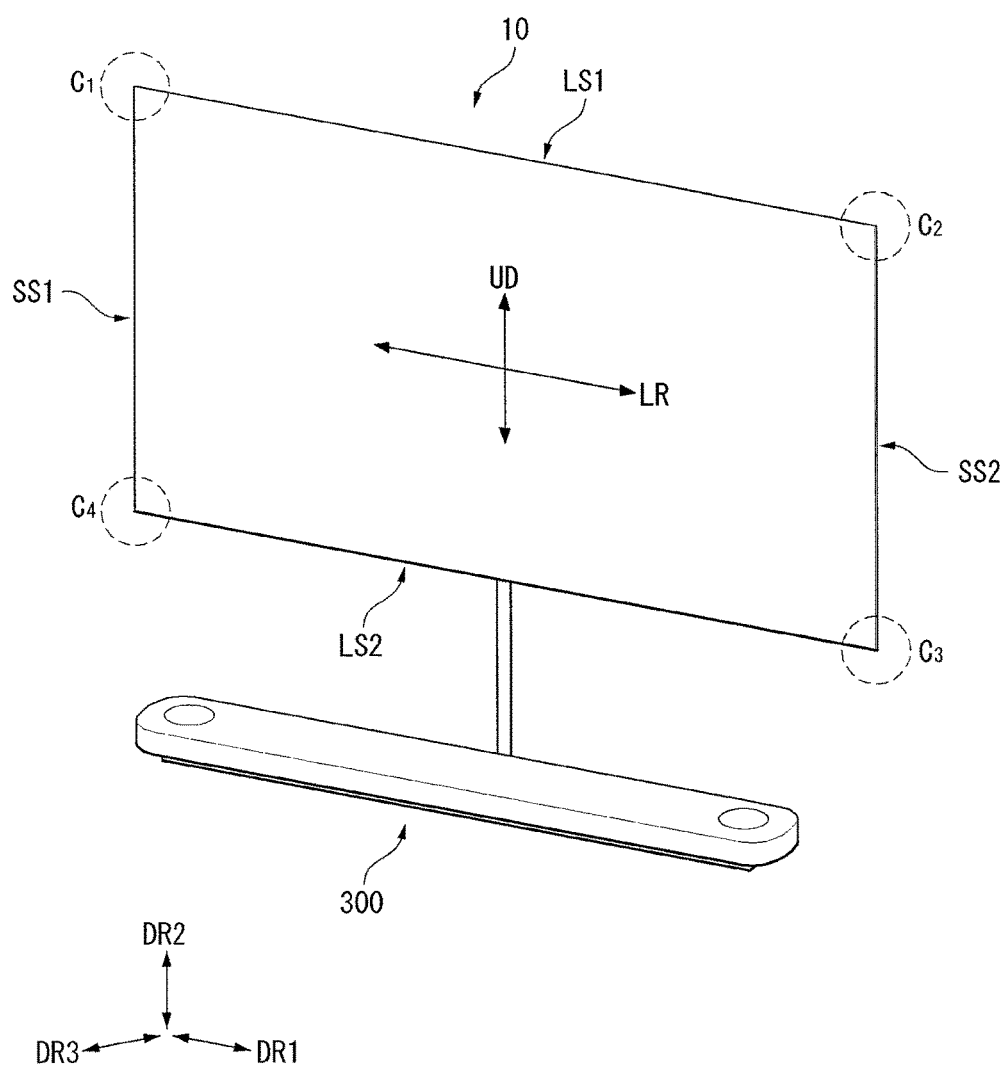
FIGS. 6 to 8 are views showing a control unit according to an embodiment of the present invention.
Figure 7:
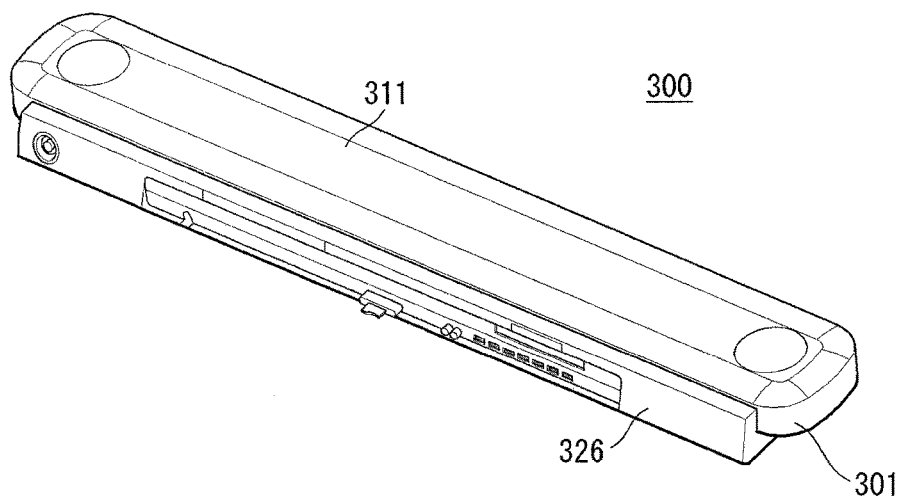

Referring FIGS. 6 and 7, the control unit 300 is spaced a certain distance from the head 10.

The control unit 300 may be electrically connected to the head 10. The control unit 300 and the head 10 may transceive electric signals to each other by being connected to wires. The control unit 300 may be connected to the head 10 wirelessly, although not shown in the drawings. In this case, the control unit 300 may transceive electric signals to the head 10 via wireless communication.

The case 301, 311, and 326 may include a bottom case 301, a top case 311, and a rear case 326. The rear case 326 may have at least one opening. The rear case 326 may form the rear surface of the control unit 300. The rear case 326 may have at least one port capable of communicating with an external device. The rear case 326 may have a terminal connected to an external power source.

Figure 8:
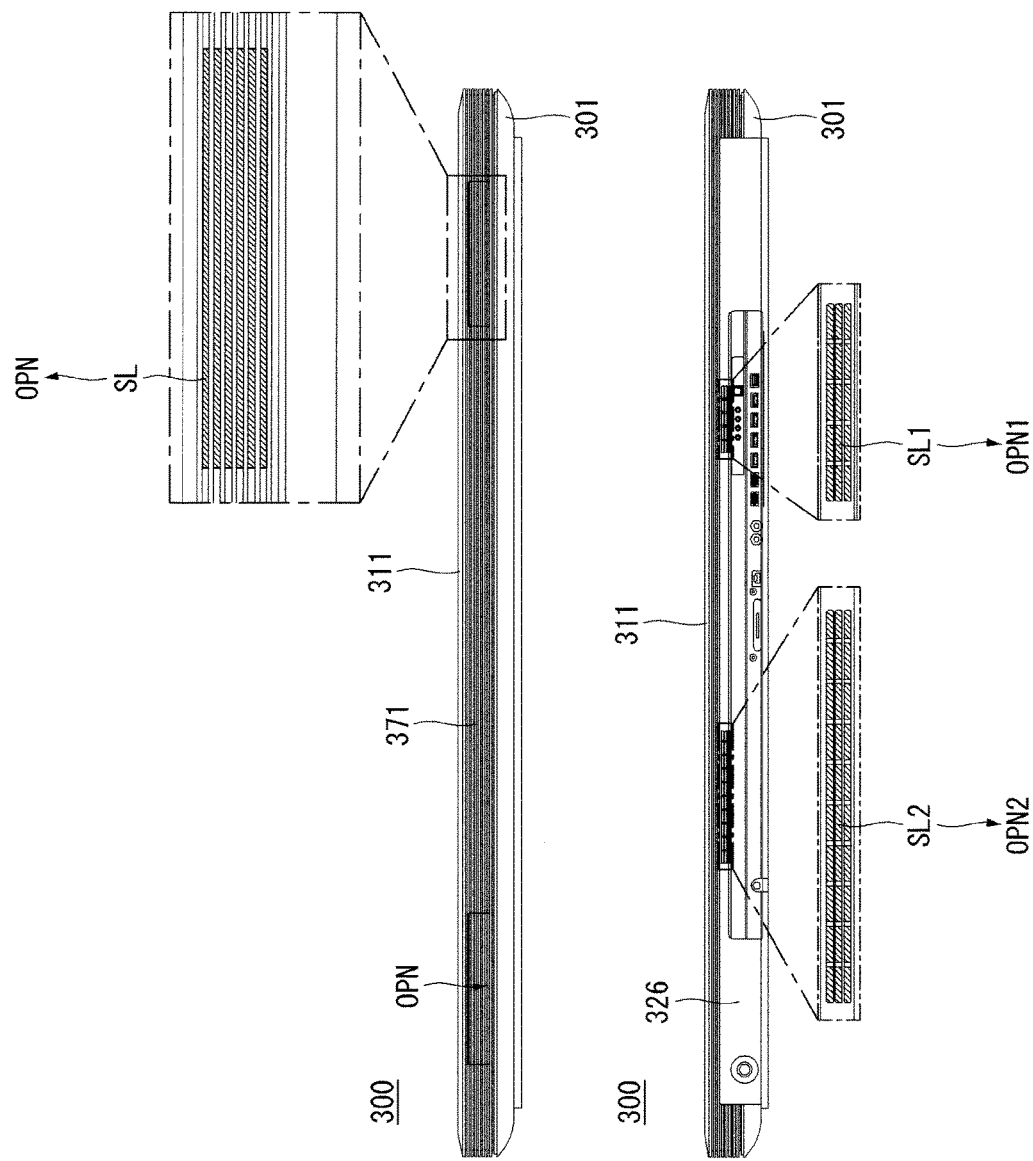

Referring to FIG. 8, the first heat dissipation portion 371 may be provided on the front surface of the control unit 300. The electronic components included in the control unit 300 can be heated up while operating. The first heat dissipating portion 371 may transmit heat generated from the electronic components located inside the case 301, 311, and 326 to the outside of the case 301, 311, and 326. The first heat dissipation portion 371 may be made of a metal. Metals can have excellent heat conductivity.

The opening OPN may be formed in the first heat dissipation portion 371. The opening OPN may include at least one slit SL. A plurality of slits SL may be formed as a passage in the case 301, 311, and 326 so that the air (hereinafter referred to as 'inside air') inside of the case 301, 311 and 326 or the air (hereinafter referred to as 'outside air') outside of the case 301, 3011 and 326 can get in and out through the slits SL. The control unit 300 may stand for the case 300 from the viewpoint of a ventilation.

A speaker (not shown) may be positioned inside the opening OPN formed in the front surfaces of the case 301, 311, and 326. A speaker grille (not shown) may be disposed between the speaker (not shown) and the opening OPN. A part of the outside air flowing toward the opening OPN of the first heat dissipation portion 371 may not enter the inside of the control unit 300 by a speaker grill (not shown). That is, the opening OPN can be divided into a region communicated with the inside and outside, and a region blocked with another component. The ratio of the area in which the inside and outside of the opening OPN communicate with each other with respect to the whole area of the opening OPN (hereinafter referred to as the opening ratio) can be considered.

The opening ratio of the opening OPN located in the first heat dissipation portion 371 may be less than 100% by the speaker grill (not shown) adjacent to the opening OPN. The opening ratio of the opening OPN located in the first heat dissipation portion 371 may be, for example, 25%. The area of the opening OPN located in the first heat dissipation portion 371 can be designed in consideration of the opening ratio.

The rear case 326 may be provided on the rear surface of the control unit 300. The rear case 326 may include at least one opening OPN1 and OPN2. For example, the rear case 326 may include a first opening OPN1 and a second opening OPN2.

The first opening OPN1 may be a passage through which the inside air is discharged to the outside. An air fan (not shown) may be disposed adjacent to the first opening OPN1 to discharge the internal air to the outside. The air fan may form a pressure difference between the internal air pressure and the external air pressure. The first opening OPN1 may include at least one first slit SL1. The opening ratio of the first opening OPN1 may be, for example, substantially 100%.

The second opening OPN2 may be a passage through which the outside air flows into the inside of the control unit 300. As the outside air pressure becomes larger than the inside air pressure by the air fan, the outside air may flow into the inside of the control unit 300 through the second opening OPN2. The opening ratio of the second opening OPN2 may be, for example, substantially 100%.

The second opening OPN2 may include at least one second slit SL2. The second slit SL2 may form a narrow gap to increase the speed of the outside air flowing into the inside of the rear case 326. Air having a high speed may be advantageous to lower the temperature of the electronic component compared to air having a low speed.

The area of the second opening OPN2 may be larger than the area of the first opening OPN1. As the area of the second opening OPN2 is smaller, the speed of the outside air passing through the second opening OPN2 is increased, which is advantageous for local cooling. However, if the exothermic electronic components are uniformly arranged inside the case 300, the small area of the second opening OPN2 may be disadvantageous for overall cooling. As the area of the second opening OPN2 is larger, the speed of the outside air passing through the second opening OPN2 is slowed down, which may be disadvantageous for local cooling. However, if the exothermic electronic components are uniformly arranged inside the case 300, the large area of the second opening OPN2 may be advantageous for overall cooling.

Therefore, the size, the opening ratio, the position, etc. of the openings OPN, OPN1 and OPN2 can be all variables for cooling of the electronic components. That is, these correlations may be factors to be considered in terms of heat dissipation of electronic components.

Figure 9:
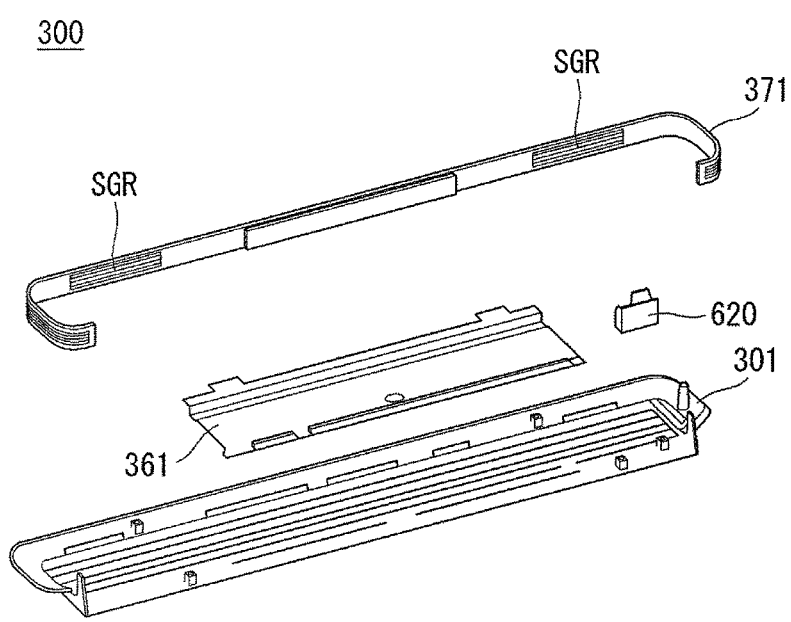
FIGS. 9 to 19 are views illustrating examples of a control unit according to an embodiment of the present invention.

Referring to FIG. 9, the bottom case 301 may form the bottom surface of the case 300. The inner bottom surface of the bottom case 301 may have a corrugated shape. The corrugation formed on the inner bottom surface of the bottom case 301 can be a passage through which the air moves. The bottom case 301 may have an accommodation space.

The bottom plate 361 may be disposed on the inner bottom surface of the bottom case 301. The bottom plate 361 may be seated in the accommodation space formed in the bottom case 301. The bottom plate 361 may be spaced from the bottom surface of the bottom case 301. The bottom plate 361 may be elongated along the longitudinal direction of the bottom case 301. The bottom plate 361 may be formed of a metal or may be made of a metal.

The communication module 620 may cause the control unit 300 to transmit or receive information or electrical signals with other units. The communication module 620 may perform Wi-fi communication, for example, wirelessly connected to the Internet. In another example, the communication module 620 may receive a signal from the remote control. In another example, the communication module 620 can perform Bluetooth communication with the mobile terminal.

The first heat dissipation portion 371 may form a part or all of the lateral surface of the case 300. The first heat dissipation portion 371 may be connected to the bottom plate 361. The heat transmitted from the bottom plate 361 to the first heat dissipation portion 371 can be transferred to the outside air.

The exterior surface of the first heat dissipation portion 371 may have a corrugated shape. The first heat dissipation portion 371 may have increased surface area in contact with the outside air can be increased. When the surface area of the first heat dissipation portion 371 contacting the outside air is increased, the heat dissipation efficiency of the first heat dissipation portion 371 can be improved. That is, the first heat dissipation portion 371 may have a dissipation fin 371a on its outer surface. The first heat dissipation portion 371 may include a plurality of dissipation fins 371a and the first dissipation portion 371 and the dissipation fin 371a may be elongated along the circumference of the cases 300.

The speaker grill SGR may be located at inner side of the first heat dissipation portion 371. The speaker grill SGR may be referred to as a grill SGR. The speaker grill SGR can protect the speaker (not shown). The speaker grill SGR may be disposed near the speaker (not shown) at the first heat dissipation portion 371. The sound provided by the speaker (not shown) may be discharged to the outside through the first dissipation portion 371 or the speaker grill SGR. Therefore, the speaker grill SGR may be positioned adjacent to the rear surface of the opening (OPN, see FIG. 8) located in the first heat dissipation portion 371. For example, the opening ratio of the speaker grill SGR may be 25 percent. That is, the fluid can pass through only a quarter of the total area of the speaker grill SGR. The opening ratio of the speaker grill SGR may be designed in consideration of the amount of air entering the speaker grill SGR without being observed from the outside.

Figure 10:
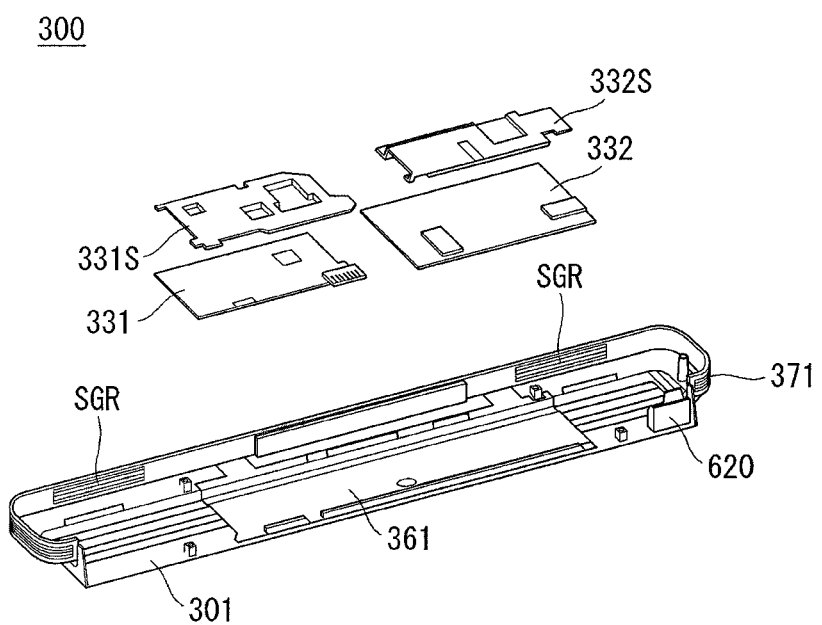

Referring to FIG. 10, the first electronic components 331 and 332 may be located above the bottom plate 361. The first electronic components 331 and 332 may be positioned in the accommodation space of the bottom case 301. The first electronic components 331 and 332 may be in contact with the bottom plate 361. The first electronic components 331 and 332 may be exothermic. The first electronic components 331 and 332 may perform heat exchange with the bottom plate 361. Heat may be transferred from the first electronic component 331 to the bottom plate 361, for example.

The first electronic components 331 and 332 may be supported by bosses or protrusions or pillar formed at the bottom plate 361. A path through which air can move may be formed between the bottom plate 361 and the first electronic components 331 and 332. The air may exchange heat with the first electronic components 331, 332 and/or the bottom plate 361 while moving the path formed between the first electronic components 331, 332 and the bottom plate 361, and then may exit.

The first electronic components 331 and 332 may be plural. For example, the first electronic components 331 and 332 may include a T-con board 331 and a main circuit board 332. The first electronic components 331 and 332 may generate a relatively small amount of heat as compared with the second electronic components 341 and 342 described later. The heat can be dissipated by the heat sink by the heat transfer method. Heat dissipation method can be different according to the heat generated in the electronic components.

The main circuit board 332 may process electric signals. The main circuit board 332 can be electrically connected to electronic components included in the control unit 300. The main circuit board 332 may transceive electric signals to at least a part of the electronic components included in the control unit 300. The main circuit board 332 may control the electronic components contained in the control unit 300. The main circuit board 332 may generate heat during operation.

The T-con board 331 may provide an electric signal relating to the image to a display panel connected to the control unit 300 or a head 10 (see FIG. 6) including the same. The T-con board 331 can process electric signals relating to graphics. The T-con board 331 may be electrically connected to the main circuit board 332.

The first electronic component covers 331S and 332S may be located above the first electronic components 331 and 332. The first electronic component covers 331S and 332S may contact the first electronic components 331 and 332. The first electronic component covers 331S and 332S can protect the first electronic components 331 and 332. The first electronic component covers 331S and 332S may have excellent thermal conductivity. For example, the first electronic component covers 331S and 332S may be made of a metal. The first electronic component covers 331S and 332S may be referred to as first covers 331S and 332S or first plates 331S and 332S.

The first electronic component covers 331S and 332S may be provided in plural. For example, the first electronic component covers 331S and 332S may include a T-con board cover 331S and a main circuit board cover 332S.

Figure 11:
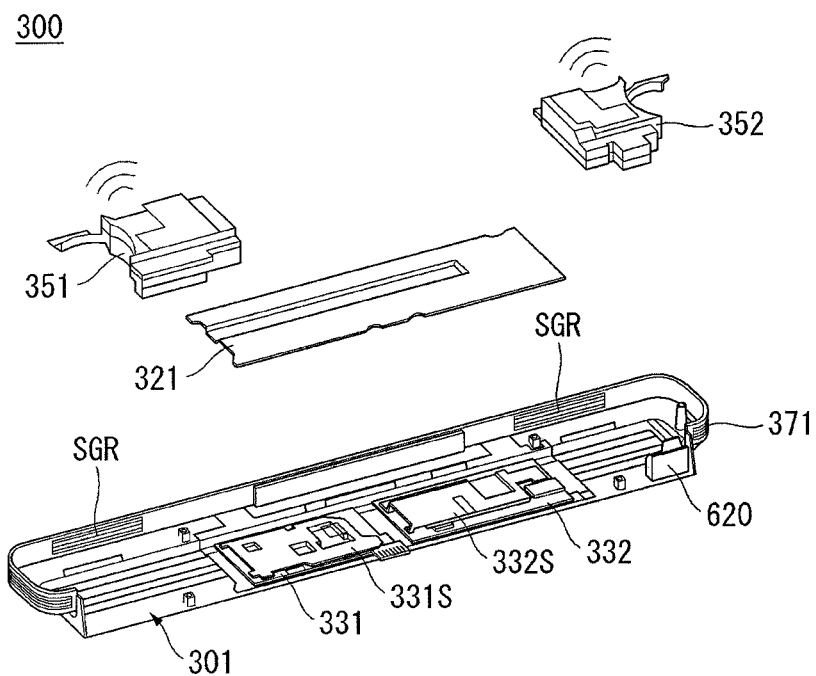

Referring to FIG. 11, the middle case 321 may be located above the first electronic components 331 and 332. The middle case 321 may be located above the first electronic component covers 331S and 332S. A space may be formed between the first electronic component covers 331S and 332S and the middle case 321. The space between the middle case 321 and the first electronic component covers 331S and 332S may be a passage through which the air moves. The middle case 321 may be referred to as a stand 321 or a middle stand 321.

The middle case 321 may be installed at the bottom case 301. The middle case 321 may be installed in the accommodation space of the bottom case 301. A space may be formed between the middle case 321 and the bottom case 301. The first electronic components 331 and 332 and the first electronic component covers 331S and 332S may be accommodated in the space formed between the middle case 321 and the bottom case 301.

The middle case 321 may be a plate. The middle case 321 may include a boss or a projection or a column on its upper surface. Or the middle case 321 may have a corrugated shape on its upper surface. The boss or projection or pillar or corrugation formed on the upper surface of the middle case 321 may support an electronic component disposed on the upper surface of the middle case 321.

The first stationary speaker 351 and the second stationary speaker 352 may be positioned adjacent to both ends of the bottom case 301. The first stationary speaker 351 and the second stationary speaker 352 may be mounted on the bottom case 301. The first stationary speaker 351 and the second stationary speaker 352 may be disposed on the rear surface of the speaker grill SGR. The first and second stationary speakers 351 and 352 may be installed in the accommodation space of the bottom case 301.

The middle case 321 may be positioned between the first stationary speaker 351 and the second stationary speaker 352. The first stationary speaker 351 and the second stationary speaker 352 may receive an electric signal and provide sound. The first stationary speaker 351 and the second stationary speaker 352 may provide sound toward the front of the control unit 300. The direction from the first stationary speaker 351 toward the second stationary speaker 352 may be referred to as the longitudinal direction of the control unit 300 or the longitudinal direction of the bottom case 301.

The first stationary speaker 351 and the second stationary speaker 352 may provide stereo sound. The first stationary speaker 351 and the second stationary speaker 352 may be spaced apart a certain distance from each other. The first stationary speaker 351 and the second stationary speaker 352 can provide stereophonic sound.

Figure 12:
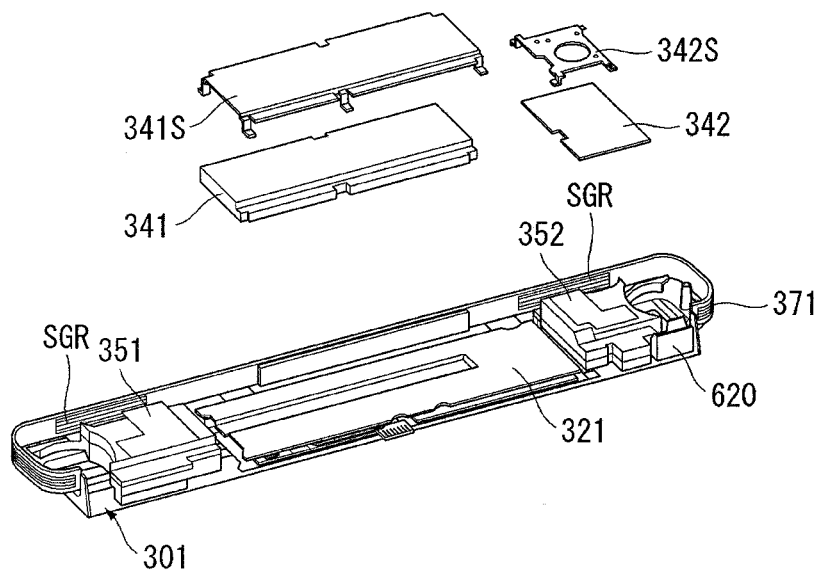

Referring to FIG. 12, the second electronic components 341 and 342 may be disposed on the middle case 321. The second electronic component 341, 342 may be supported by the middle case 321. The second electronic component 341, 342 may be in contact with the middle case 321. A space may be formed between the second electronic components 341 and 342 and the middle case 321.

The space formed between the second electronic components 341 and 342 and the middle case 321 may be a path through which air can move. The air moving in the spaces formed between the second electronic components 341 and 342 and the middle case 321 can perform heat exchange with the second electronic components 341 and 342. The second electronic component 341, 342 may be cooled by the air moving adjacent to them.

The temperature of the second electronic components 341 and 342 may be lowered by transferring heat to the air adjacent to the second electronic components 341 and 342. The performance of the second electronic components 341 and 342 may degrade at high temperatures. Therefore, it may be necessary to keep the temperature of the second electronic component 341, 342 below the proper level.

The second electronic component covers 341S and 342S may be located above the second electronic components 341 and 342. The second electronic component covers 341S and 342S may protect the second electronic components 341 and 342. The second electronic component covers 341S and 342S may contact the upper surfaces of the second electronic components 341 and 342. The second electronic component covers 341S and 342S may receive heat from the second electronic components 341 and 342. The second electronic component covers 341S and 342S may be formed of a metal or may include a metal. The second electronic component covers 341S and 342S may be referred to as second covers 341S and 342S or second plates 341S and 342S.

The second electronic components 341 and 342 may be provided in plural. For example, the second electronic components 341 and 342 may include a power supply unit 341 and a sub circuit board 342.

The power supply unit 341 may receive electric power from the external power source. The electric power supplied to the power supply unit 341 may be an AC electric power. The electronic component contained in the control unit 300 or another unit connected to the control unit 300 may require a DC electric power. The power supply unit 341 may convert the AC electric power into DC electric power and supply the DC electric power to the electronic component included in the control unit 300 or another unit connected to the control unit 300. The other unit connected to the control unit 300 may be the head 10 or the display unit 10 (see FIG. 5). That is, the power supply unit 341 may provide the display unit 10 with electric power.

The electric power supplied to the power supply unit 341 may have a relatively high voltage. The electronic components contained in the control unit 300 or other units connected to the control unit 300 may require a relatively low voltage. The power supply unit 341 may convert the relatively high voltage to the relatively low voltage and supply the relatively low voltaged power to an electronic component or another unit connected to the control unit 300.

A power loss may occur in the process of receiving and converting power from the external power source by the power supply unit 341. A large amount of heat may be generated due to a power loss generated in the power supply unit 341. The thermal energy generated in the power supply unit 341 may raise the temperature of the power supply unit 341. When the temperature of the power supply unit 341 rises, the efficiency of the power supply unit 341 may be lowered. By moving the air adjacent to the power supply 341 and cooling the power supply 341, the temperature rise of the power supply 341 may be suppressed.

Sub-circuit board 342 may process at least some of the electric signals processed by control unit 300. The sub-circuit board 342 may be electrically connected to the power supply unit 341.

The second electronic component covers 341S and 342S may be provided in plural. For example, the second electronic component covers 341S and 342S may include a power supply unit cover 341S and a sub-circuit board cover 342S.

The power supply unit cover 341S may be disposed above the power supply unit 341. Sub-circuit board cover 342S may be disposed above sub-circuit board 342. The power supply unit cover 341S may receive the heat from the power supply unit 341 and transmit the heat to the air to suppress the temperature rise of the power supply unit 341. The sub-circuit board cover 342S may receive heat from the sub-circuit board 342 and transfers the heat to the air to suppress the temperature rise of the sub-circuit board 342.

Figure 13:
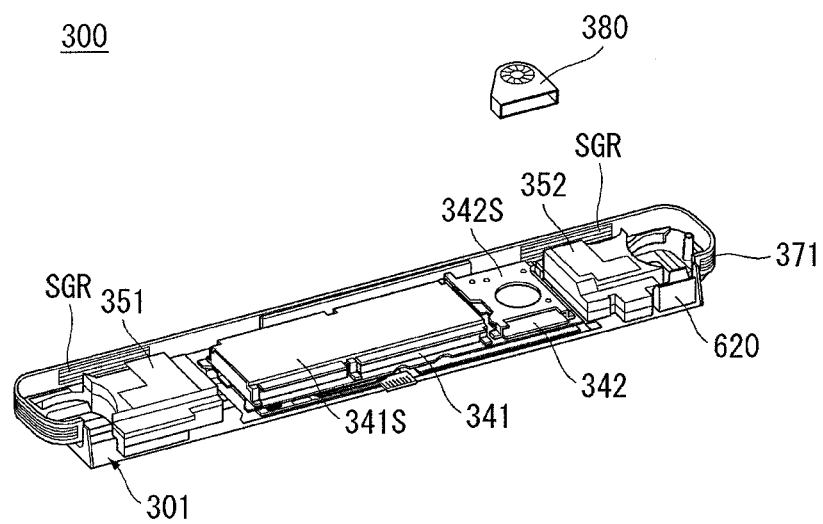

Referring to FIG. 13, the air fan 380 may be referred to as a cooling fan 380. The air fan 380 may suck air in one direction and may discharge air in the other direction. For example, the air fan 380 may be a rococo fan. The direction of the air flowing into the air fan 380 may be a plurality of directions.

The air fan 380 may cause a difference in air pressure between inside and outside of the case 301. Due to a difference in air pressure between the inside and outside of the case 300, the outside air may flow into the case 301 or the inside air may flow out of the case 301.

The air fan 380 may be disposed on the upper portion of the middle case 321. The air fan 380 may be mounted on the top of the second electronic component cover 342S. Or the air fan 380 may be mounted on the upper portion of the sub-circuit board cover 342S. A space may be formed between the air fan 380 and the second electronic component cover 342. The space formed between the air fan 380 and the second electronic component cover 342 may be a passage through which the air flows into the air fan 380. The air fan 380 may suck air from the upper surface and/or the lower surface.

Figure 14:
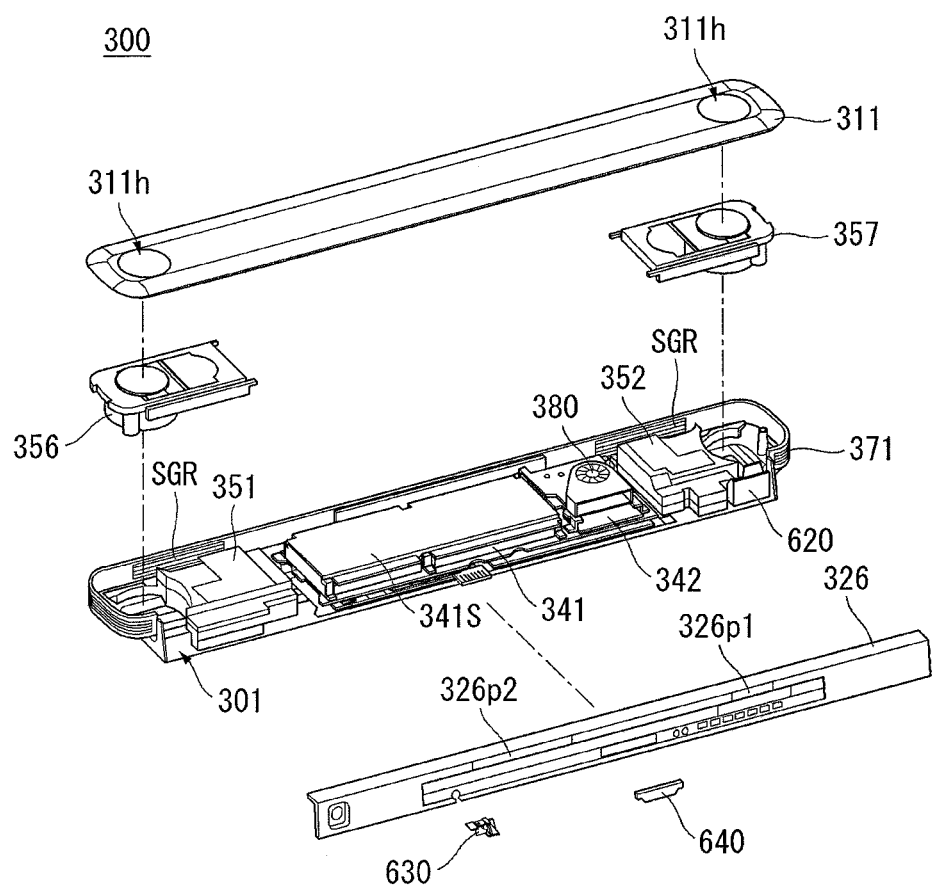

Referring to FIG. 14, the first movable speaker 356 and the second movable speaker 357, together with the first stationary speaker 351 and the second stationary speaker 352, may provide multiple sounds. The first movable speaker 356 and the second movable speaker 357 may be disposed adjacent to both sides of the bottom case 301. The first and second movable speakers may be installed in the accommodation space of the bottom case 301. The first movable speaker 356 and the second movable speaker 357 can move. For example, the first movable speaker 356 and/or the second movable speaker 357 may move and protrude out of the case when the control unit 300 is activated. The first movable speaker 356 and the second movable speaker 357 may provide sound upward. A speaker module may stand for at least one of movable speakers 356, 357 and stationary speakers 351, 352. A speaker may stand for the speaker module.

The top case 311 may form the upper surfaces of the case 300. The top case 311 may be located above the speakers 351, 352, 356, and 357. A space may be formed between the top case 311 and the second electronic component cover 341S. The space formed between the top case 311 and the second electronic component cover 341S may be a passage through which the air moves.

A space may be formed between the top case 311 and the air fan 380. The space formed between the top case 311 and the air fan 380 may be a passage through which the air moves.

The top case 311 may be fixed to or coupled with or attached to or mounted on the bottom case 301. The top case 311 may be coupled with or connected to the first heat dissipation portion 371. The top case 311 may have holes 311h at both ends thereof. Holes 311h formed at both ends of the top case 311 may provide a space where the first movable speaker 356 and the second movable speaker 357 protrude. The hole 311h may be referred to as an opening 311h.

The rear case 326 can form the rear surfaces of the case 300. The rear case 326 may be positioned between the bottom case 301 and the top case 311. The rear case 326 may be connected to the bottom case 301 and the top case 311.

The rear case 326 may provide a passage through which air moves in and out the case 300. For example, the rear case 326 may form an opening 326P1 adjacent to the air fan 380. The opening 326P1 adjacent to the air fan 380 may be a passage through which air is discharged from the inside of the case 300 to the outside. As another example, the rear case 326 may form an opening 326P2 spaced apart from the air fan 380. The opening 326P2 may be a passage through which the outside air flows into the case 300. The opening 326P1 may be referred to as a first opening 326P1 and the opening 326P2 may be referred to as a second opening 326P2. Alternatively, the opening 326P1 may be referred to as a discharge gate 326P1, and the opening 326P2 may be referred to as an inlet gate 326P2.

The power terminal 630 may be located on one side of the rear case 326. The power terminal 630 may be connected to an external power source. The power terminal 630 may be electrically connected to the power supply unit 341.

A cable terminal 640 may be located on the rear case 326. The cable terminal 640 may be connected to, for example, the head 10 (see FIG. 5). The cable terminal 640 may be electrically connected to the first electronic components 331 and 332. For example, the cable terminal 640 may be electrically connected to the T-con board 331. An electric signal relating to an image may reach the head 10 (see FIG. 5) via the T-con board 331 and the cable terminal 640.

Referring to 15 (a), the bottom case 301, the bottom plate 361, the first electronic components 331 and 332, the first electronic component covers 331S and 332S, the middle case 321, the second electronic components 341 and 342, second electronic component covers 341S and 342S, an air fan 380, a first heat dissipation portion 371, speakers 351, 352, 356 and 357, and a top case 311 are shown.

The structure of at least a part of the control unit 300 can be understood as a stacked structure. For example, the bottom case 301, the bottom plate 361, the first electronic components 331 and 332, the first electronic component covers 331S and 332S, the middle case 321, the second electronic components 341 and 342, and the top case 311 may be sequentially stacked. Here, a space may be formed in the stacked structure. The space formed in the stacked structure may be a passage through which the air moves. The middle case 321 can be supported or fixed by the boss 321B.

Referring to 15 (b), the bottom case 301, the bottom plate 361, the first electronic components 331, 332 and 342, the first electronic component covers 331S, 332S and 342S, the second electronic component 341, the second electronic component cover 341S, the air fan 380, the first heat dissipation portion 371, the speakers 351, 352, 356, and 357, and a top case 311 are shown.

The second electronic component 341 may be, for example, a power supply unit 341. The power supply unit 341 may be provided in plurality. For example, when the power necessary for operation of the control unit 300 is increased, the power supply unit 341 may be provided in plural.

The air fan 380 may be disposed adjacent to the power supply unit 341. The air fan 380 may be installed on the middle case 321. A space may be formed between the air fan 380 and the middle case 321. The space formed between the air fan 380 and the middle case 321 may be a passage through which the air moves. A space may be formed between the air fan 380 and the top case 311. The space formed between the air fan 380 and the top case 311 may be a passage through which the air moves.

Figure 15:
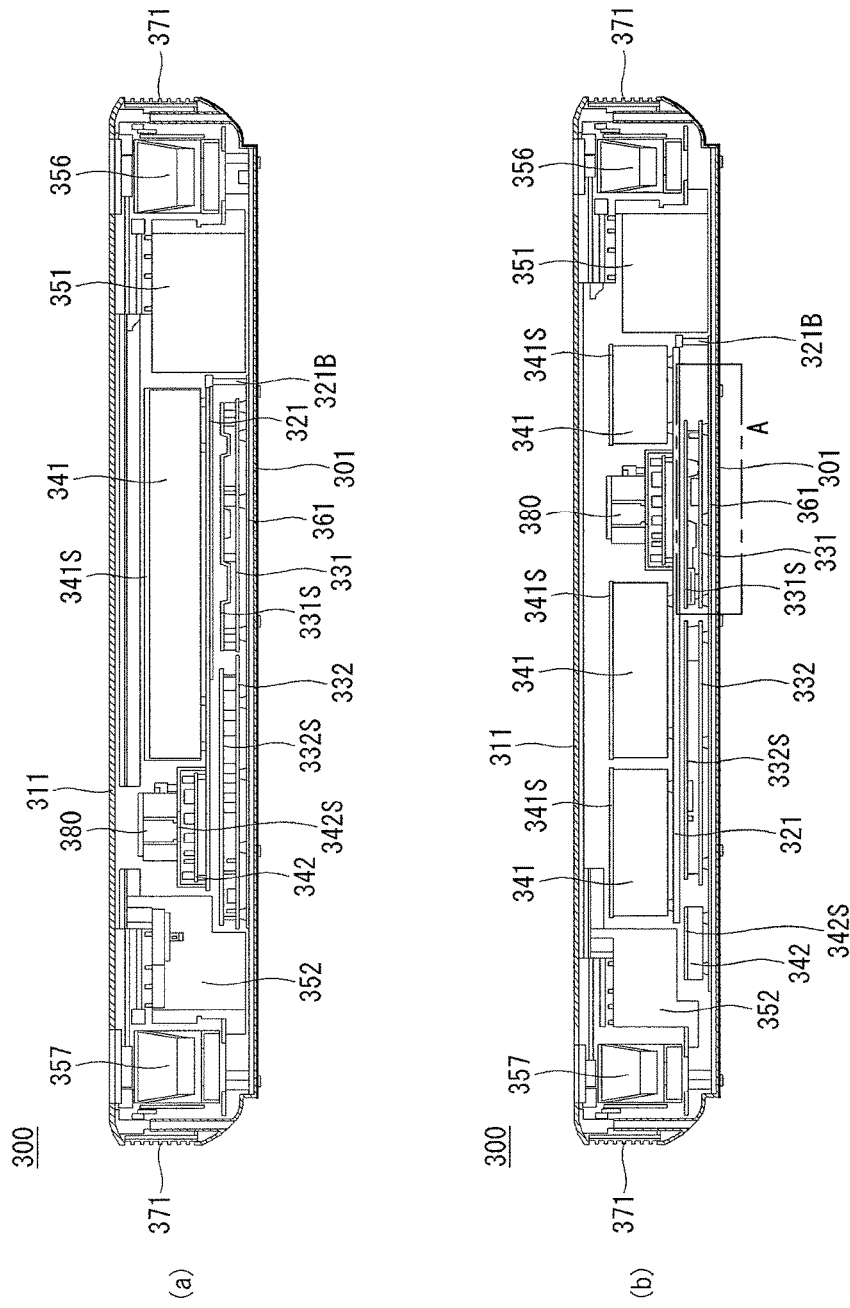
Figure 16:
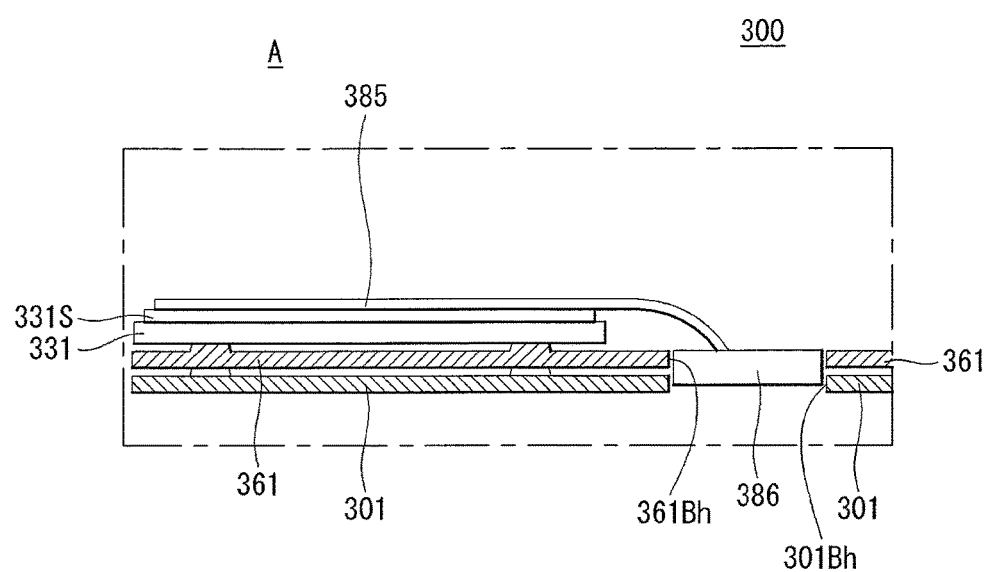

Referring to FIG. 16, it can be an example of the area A in FIG. 15. The second heat transfer portion 385 may contact the upper surface of the first electronic component cover 331S. The second heat transfer portion 385 may have a flat shape. The second heat transfer portion 385 may receive the heat generated from the first electronic component 331 through the first electronic component cover 331S and may transfer the heat to a second heat dissipation portion 386.

The second heat transfer portion 385 may comprise a metal. The second heat transfer portion 385 may be made of an aluminum, for an example. The second heat transfer portion 385 may be flexible.

The second heat dissipation portion 386 may be located on the bottom case 301. The second heat dissipation portion 386 may be disposed in a hole 301Bh formed on the bottom case 301 or/and a hole 361Bh formed on the bottom plate 361.

The second heat dissipation portion 386 may be connected to the second heat transfer portion 385. The second heat dissipation portion 386 may be exposed to the outside of the case 300. The second heat dissipation portion 386 may receive heat from the second heat transfer portion 385 and may dissipate the heat. The second heat dissipation portion 386 may be made of a metal.

The first electronic component 331 may be a T-con board 331. A part of the heat generated in the T-con board 331 may be discharged to the outside by air. Another portion of the heat generated in the T-con board 331 may be transmitted to the bottom plate 361. The heat transferred to the bottom plate 361 may be discharged to the outside of the bottom plate 361 through air. Another part of the heat generated in the T-con board 331 may be transmitted to the T-con board cover 331S.

A part of the thermal energy reached the T-con board cover 331S may be emitted to the outside through radiation or heat conduction (with respect to air). Another portion of the thermal energy reached the T-con board cover 331S may be transferred to the second heat transfer portion 385.

Figure 17:
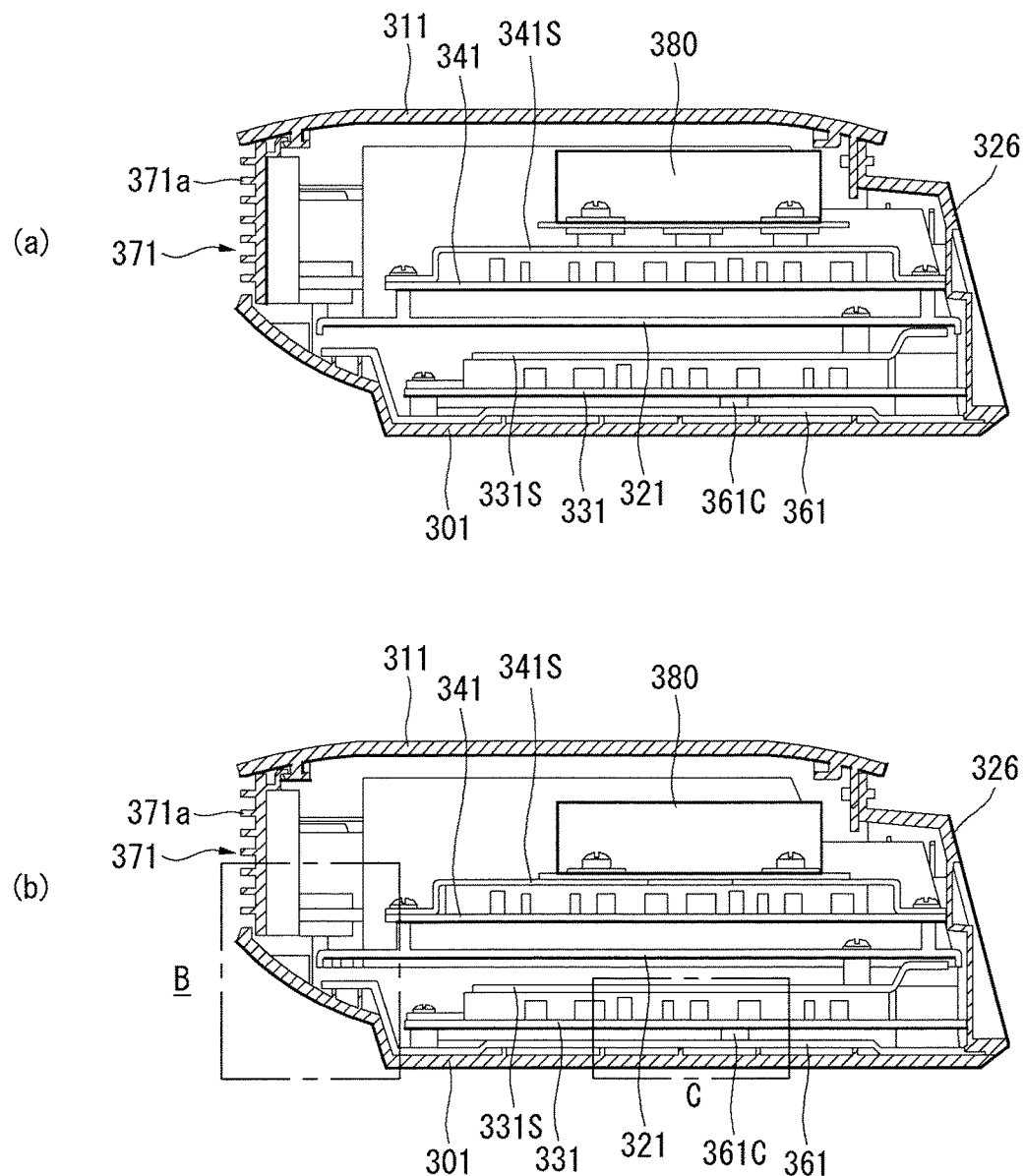

Referring to FIG. 17, the bottom plate 361 may be positioned on the top surface of the bottom case 301. The bottom plate 361 may have a projection 361C or a column 361C on the upper surface of the bottom plate 361. The protrusion 361C may support the first electronic component 331. A space may be formed between the bottom plate 361 and the first electronic component 331.

The air fan 380 may be disposed between the top case 311 and the second electronic component cover 341S. Referring to FIG. 17 (a), the air fan 380 may be adjacent to the top case 311. Referring to FIG. 17 (b), the air fan 380 may be adjacent to the second electronic component cover 341S rather than the top case 311. The air fan 380 may be adjacent to the center of the case 301, 311, 326 as it approaches the second electronic component cover 341S.

The speed of the air flowing inside the case 300 may be varied depending on the position of the air fan 380. The air flowing inside the case 300 may perform heat exchange with the electronic components 331 and 332 and the like. The speed of the air flowing inside the case 300 may affect the temperature of the electronic components 331 and 332. In other words, the position of the air fan 380 may affect the temperature of the electronic components 331 and 332.

Figure 18:
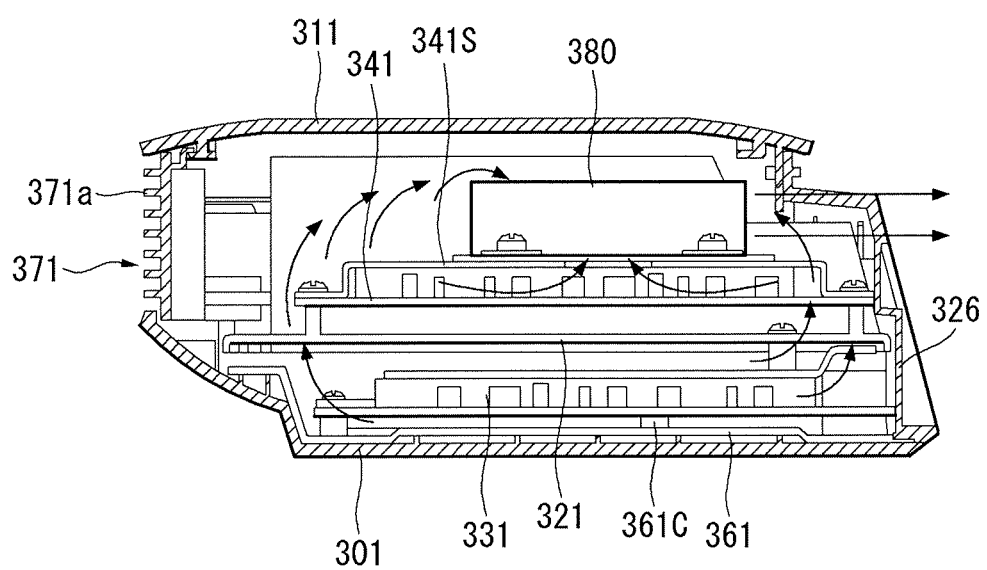
Figure 19:
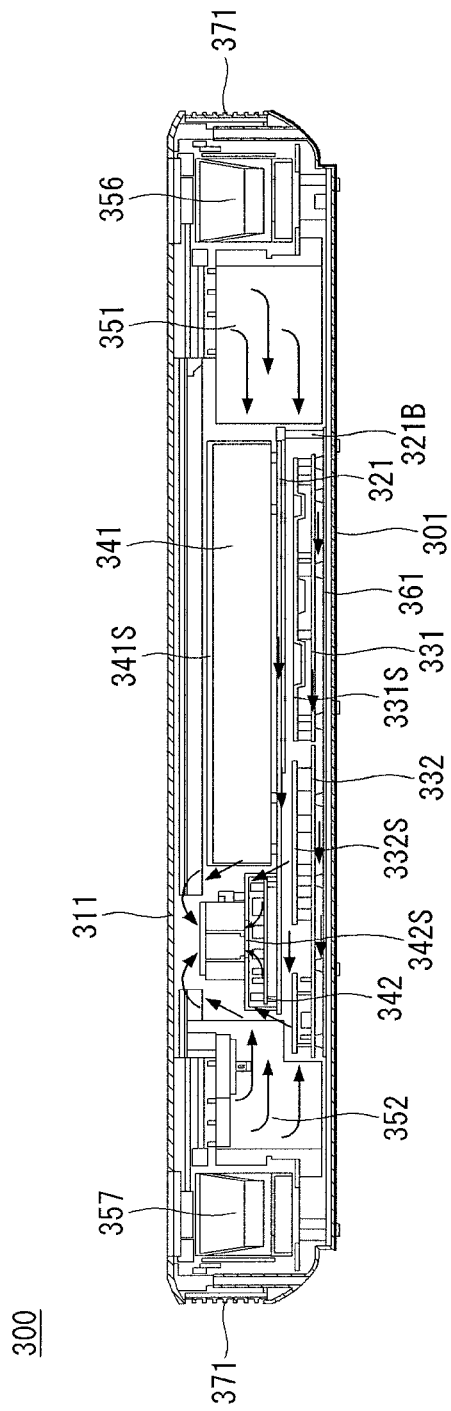

Referring to FIGS. 18 and 19, the flow of air in the control unit 300 is indicated by arrows. The air fan 380 can discharge the inside air to the outside. The air pressure difference may be generated at a boundary between the inside and the outside of the case 300, because of the air fan 380.

The outside air introduced into the case 300 may be blown into the electronic components 331 and 341 and/or the bottom plate 361 and/or the electronic components cover (not shown) disposed between the top case 311 and the bottom case 301 331S, 341S, and the like, and may be discharged to the outside of the case 300 after reaching the air fan 380.

The outside air introduced into the case 300 may pass through air paths formed between the top case 311 and the bottom case 301. The middle case 321 may be disposed between the top case 311 and the bottom case 301 to secure the space and/or the length of the air path.

Figure 20:
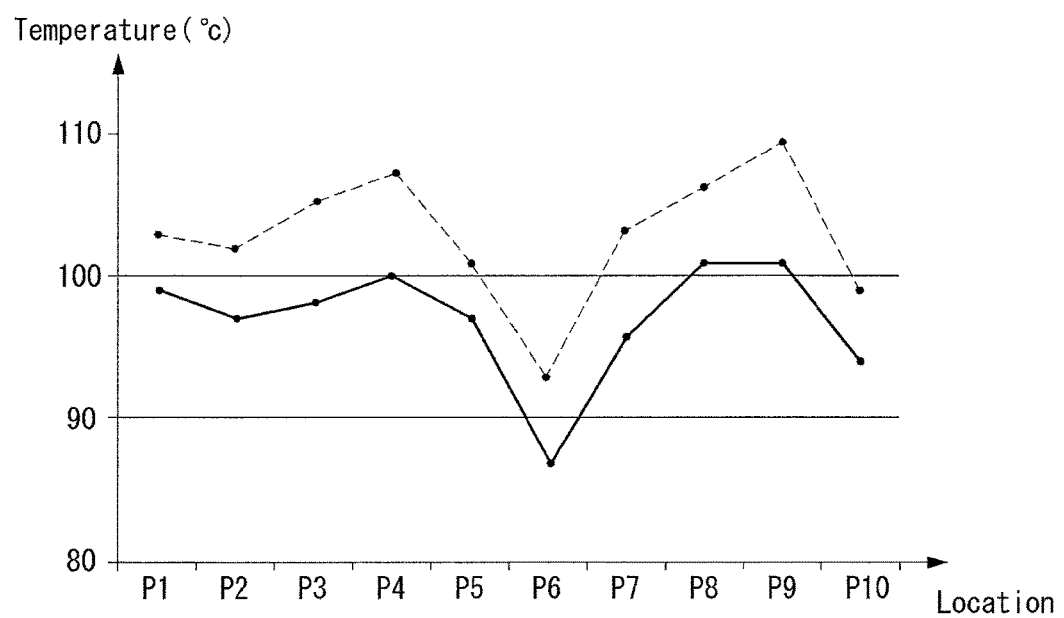
FIG. 20 is a view showing an example of the heat dissipation effect of the control unit according to an embodiment of the present invention.

Referring to FIG. 20, the temperatures of the second electronic components 341 and 342 (see FIG. 17) according to the position of the air fan 380 (see FIG. 17) are graphically displayed.

The plurality of points P1 to P10 may represent different points of the second electronic components 341 and 342 (see FIG. 17). The dotted line may represent a temperature of the electronic component in case that the air fan 380 (see FIG. 17) is adjacent to the top case 311 (see FIG. 17). The solid line may represent a temperature of the electronic component in case that the air fan 380 (see FIG. 17) is adjacent to the middle case 321 (see FIG. 17).

The temperature of the electronic component at the points P1 to P10 in case that the air fan 380 (see FIG. 17) is adjacent to the middle case 321 (see FIG. 17), may be lower than the temperature of the electronic component at the points P1 to P10 in case that the air fan 380 (see FIG. 17) is adjacent to the top case 311 (see FIG. 17).

If the position of the air fan 380 (see FIG. 17) is changed under the same conditions, the flow of air moving inside the case 300 may be changed. The air moving inside the case 300 may perform heat exchange with an electronic component. The amount of heat exchanged between the air and the electronic component in contact with the air may vary depending on the throughput of the air.

By arranging the air fan 380 adjacent to the middle case 321 (FIG. 17), the heat emitted by the second electronic components 341 and 342 becomes relatively large, and the relatively low temperature may be maintained.

Figure 21:
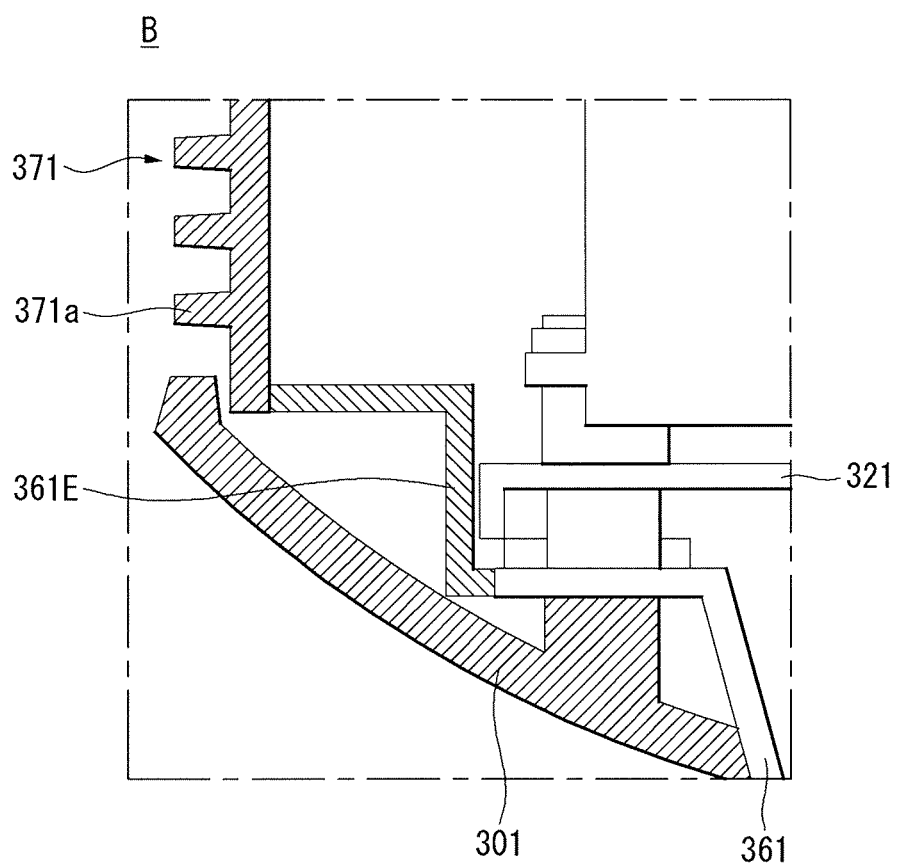
FIGS. 21 and 22 are views showing other examples of heat dissipation of the control unit according to an embodiment of the present invention.

Referring to FIG. 21, B area in FIG. 17 (b) is represented. The first heat dissipation portion 371 may be exposed toward the outside. The first heat dissipation portion 371 may include a heat dissipation fin 371a in a corrugated shape in a direction of being exposed to the outside. The first heat dissipation portion 371 may increase the area exposed to the outside by having the heat dissipation fin 371a. As the area of the first heat dissipation portion 371 exposed to the outside is increased, the heat radiated can be increased. Also, as the area of the first heat dissipation portion 371 exposed to the outside is increased, the heat transferred to the outside air may be increased.

The bottom plate 361 may include an extension portion 361E connected to the first heat dissipation portion 371. The extension portion 361E of the bottom plate 361 may be a passage through which the thermal energy of the bottom plate 371 is transmitted to the first heat dissipation portion 371. The extension portion 361E of the bottom plate 361 may include aluminum.

A part of the heat transmitted to the bottom plate 361 may be discharged to the outside of the bottom plate 361. Another portion of the heat transmitted to the bottom plate 361 may be transmitted to the extension 361E of the bottom plate 361. A part of the heat transmitted to the extension portion 361E of the bottom plate 361 may be discharged to the outside of the extension portion 361E of the bottom plate 361. Another part of the heat transmitted to the extension portion 361E of the bottom plate 361 may be transmitted to the first heat dissipation portion 371.

Figure 22:
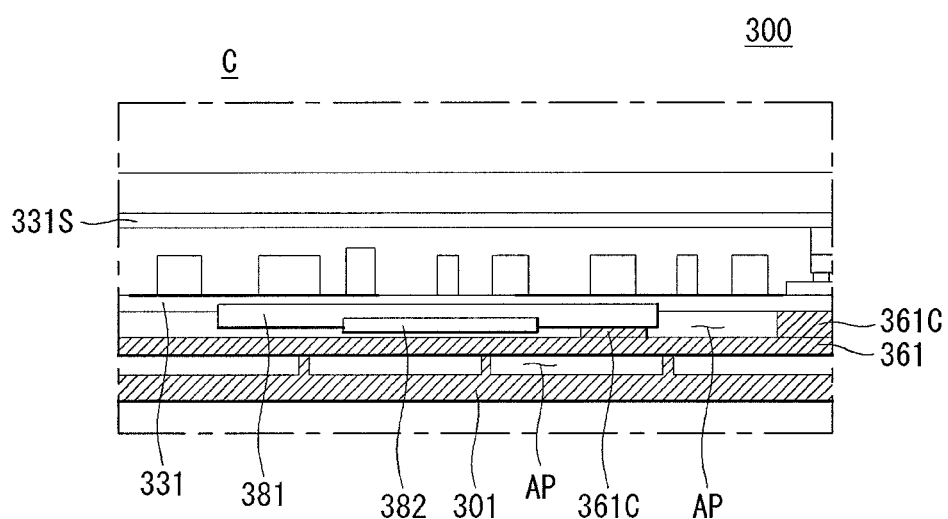

Referring to FIG. 22, the C area in FIG. 17 (c) is displayed. The third heat transfer portion 381 may be disposed between the first electronic component 331 and the bottom plate 361. The third heat transfer portion 381 may contact the lower surface of the first electronic component 331. A portion of the heat generated in the first electronic component 331 may be transferred to the third heat transfer portion 381. The third heat transfer portion 381 may be made of a metal.

The third heat dissipation portion 382 may be positioned between the third heat transfer portion 381 and the bottom plate 361. The third heat dissipation portion 382 may contact the third heat transfer member 381. The third heat transfer portion may be positioned between the first electronic component 331 and the third heat dissipation portion 382. A space may be formed between the third heat dissipation portion 382 and the bottom plate 361. The third heat dissipation portion 382 may be made of a metal.

A space may be formed between the bottom plate 361 and at least one of the first electronic component 331, the third heat transfer portion 381, and the third heat dissipation portion 382. The space may be a passage (AP) through which the air moves.

A part of the heat generated in the first electronic component 331 may be discharged to the outside of the first electronic component 331. Another portion of the heat generated in the first electronic component 331 may be transmitted to the bottom plate 361. Another portion of the heat generated in the first electronic component 331 may be transferred to the third heat transfer portion 381. A part of the heat transferred to the third heat transfer portion 381 may be discharged to the outside of the third heat transfer portion 381. Another part of the heat transferred to the third heat transfer portion 381 may be transferred to the third heat dissipation portion 382.

According to an aspect of an embodiment of this invention, there is provided a control unit comprising: a bottom case having an accommodation space; a top case positioned above the bottom case, the top case covering the accommodation space; a stand installed in the accommodation space, the stand positioned between the bottom case and the top case; a first electronic component positioned between the bottom case and the stand; a second electronic component positioned between the stand and the top case; and an air fan positioned between the stand and the top case, the air fan located adjacent to at least one of the first and second electronic components.

According to another aspect of this invention, the control unit may further comprise a rear case between the bottom case and the top case, wherein the rear case covers a portion of the accommodation space, and wherein the rear case includes a first opening formed adjacent to the air fan.

According to another aspect of this invention, the rear case may include a second opening spaced apart from the first opening, and an area of the first opening may be smaller than an area of the second opening.

According to another aspect of this invention, the second electronic component may include a power supply unit, the first opening may be located adjacent to a side of the power supply unit, and the second opening may be located adjacent to another side of the power supply unit.

According to another aspect of this invention, the control unit may further comprise a first heat dissipation portion forming a portion of the bottom case or a portion of the top case, the first heat dissipation portion including a metal; and a bottom plate, positioned on the bottom case, connected to the first heat dissipation portion.

According to another aspect of this invention, the bottom plate may contact the first electronic components.

According to another aspect of this invention, the control unit may further comprise a speaker installed in the accommodation space, and w the first heat dissipation portion may include a grill positioned adjacent to the speaker, the grill through which a sound generated from the speaker propagates toward an outside of the accommodation space.

According to another aspect of this invention, the first heat dissipation portion may include a plurality of heat dissipation fins positioned on an outer surface of the first heat dissipation portion, and the grill may be formed by the plurality of heat dissipation fins.

According to another aspect of this invention, the control unit may further comprise a first plate, positioned between the first electronic component and the stand, including a metal; a second heat dissipation portion, positioned in a hole formed at the bottom plate, exposed toward outside of the housing, connected to the first plate.

According to another aspect of this invention, there is provided a display device comprising: a head including a display panel; and the control unit. The control unit may be spaced apart from the head and connected to the head electrically.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component components and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A control unit comprising:
    a bottom case having an accommodation space and a front surface including a first grill and a second grill;
    a top case positioned above the bottom case, the top case covering the accommodation space;
    a first movable speaker positioned in the accommodation space and moving in a vertical direction;

a second movable speaker positioned in the accommodation space and moving in the vertical direction, the second movable speaker spaced apart from the first movable speaker;
a third speaker positioned between the first movable speaker and the second movable speaker and adjacent to the first movable speaker, the third speaker facing the first grill;
a fourth speaker positioned between the third speaker and the second movable speaker and adjacent to the second movable speaker, the fourth speaker facing the second grill and spaced apart from the third speaker;
a stand positioned between the third speaker, the fourth speaker, the bottom case and the top case;
a first electronic component positioned between the bottom case and the stand;
a second electronic component positioned between the stand and the top case; and
an air fan positioned between the stand and the top case, the air fan located adjacent to at least one of the first and second electronic components.

2. The control unit of claim 1, further comprising a rear case between the bottom case and the top case, wherein the rear case covers a portion of the accommodation space, and wherein the rear case includes a first opening formed adjacent to the air fan.

3. The control unit of claim 2, wherein the rear case includes a second opening spaced apart from the first opening, and wherein an area of the first opening is smaller than an area of the second opening.

4. The control unit of claim 3, wherein the second electronic component includes a power supply unit, wherein the first opening is located adjacent to a side of the power supply unit, and wherein the second opening is located adjacent to another side of the power supply unit.

5. The control unit of claim 1, further comprising:
a first heat dissipation portion, forming a portion of the bottom case or a portion of the top case, exposed toward outside of the control unit,
a bottom plate, positioned on the bottom case, connected to the first heat dissipation portion.

6. The control unit of claim 5, wherein the bottom plate contacts the first electronic components.

7. The control unit of claim 5, wherein the first heat dissipation portion further includes a plurality of heat dissipation fins adjacent to the first grill and the second grill and positioned on an outer surface of the first heat dissipation portion.

8. The control unit of claim 1, further comprising:
a first plate, positioned between the first electronic component and the stand;
a second heat dissipation portion, positioned in a hole formed at the bottom case, exposed toward outside of the control unit, connected to the first plate.

9. A display device comprising:
a display unit including a display panel, the display panel providing an image;
a housing spaced apart from the display unit, the housing including an electrical unit and a speaker module; and
a cable electrically connected with the display panel and the electrical unit,
wherein the housing includes:
a bottom case having an accommodation space and a front surface including a first grill and a second grill;
a top case positioned above the bottom case, the top case covering the accommodation space; and
a first movable speaker positioned in the accommodation space and moving in a vertical direction;
a second movable speaker positioned in the accommodation space and moving in the vertical direction, the second movable speaker spaced apart from the first movable speaker;
a third speaker positioned between the first movable speaker and the second movable speaker and adjacent to the first movable speaker, the third speaker facing the first grill;
a fourth speaker positioned between the third speaker and the second movable speaker and adjacent to the second movable speaker, the fourth speaker facing the second grill and spaced apart from the third speaker;
a stand positioned between the third speaker, the fourth speaker, the bottom case and the top case,
wherein the electrical unit comprises:
a first electronic component providing the display panel with a signal; and
a second electronic component providing the display panel with electric power.

10. The display device of claim 9, wherein the first electronic component includes a T-con board and a main circuit board.

11. The display device of claim 9, wherein the second electronic component includes a power supply unit.

12. The display device of claim 9, wherein the first electronic component and the second electronic component are stacked and spaced apart from one another.

13. The display device of claim 9, wherein the first movable speaker and the second movable speaker protrude upward when the electrical unit is activated.

14. The display device of claim 9, wherein the housing includes an air fan, and wherein the air fan is positioned adjacent to the second electronic component.

15. The display device of claim 9, wherein the housing includes:
a first heat dissipation portion, forming a portion of the bottom case or a portion of the top case exposed toward outside of the housing; and
a bottom plate, positioned on the bottom case, connected to the first heat dissipation portion.

16. The display device of claim 15, wherein the first heat dissipation portion includes a plurality of heat dissipation fins positioned on an outer surface of the first heat dissipation portion.

17. The display device of claim 9, wherein the housing includes:
a first plate, positioned between the at least one first electronic component and the stand;
a second heat dissipation portion, positioned in a hole formed at the bottom case, exposed toward outside of the housing, connected to the first plate.

* * * * *